United States Patent [19]

Lim

[11] Patent Number: 5,122,986

[45] Date of Patent: Jun. 16, 1992

[54] TWO TRANSISTOR DRAM CELL

[75] Inventor: Hank H. Lim, Mountain View, Calif.

[73] Assignee: Micron Technology, Inc., Boise, Id.

[21] Appl. No.: 785,883

[22] Filed: Oct. 30, 1991

Related U.S. Application Data

[63] Continuation of Ser. No. 615,706, Nov. 21, 1990, abandoned.

[51] Int. Cl.[5] .............................................. G11C 7/02
[52] U.S. Cl. ................................... 365/189.11; 365/150; 365/174; 365/182; 365/189.09
[58] Field of Search ................ 365/189.09, 189.11, 365/150, 174, 182, 190

[56] References Cited

U.S. PATENT DOCUMENTS

| | | | |
|---|---|---|---|
| 3,614,749 | 10/1971 | Radcliffe | 365/150 |
| 4,627,031 | 12/1986 | Van Tran | 365/190 |
| 4,636,988 | 1/1987 | Van Tran | 365/190 |
| 4,823,319 | 4/1989 | Pfennings | 365/190 |
| 5,018,106 | 5/1991 | Ul Haq et al. | 365/190 |

OTHER PUBLICATIONS

R. Feryszka et al., "Two Transistor Dynamic Memory Cell," RCA Tech. Notes, #TN1007, Apr. 9, 1975, 1,2.

*Primary Examiner*—Joseph E. Clawson, Jr.
*Attorney, Agent, or Firm*—Marger, Johnson, McCollom & Stolowitz

[57] ABSTRACT

A semiconductor memory cell includes a write row line, a read row line, a write column line, a read column line, a single MOS write transistor, and a single MOS read transistor. The write transistor has a first controlled node coupled to the write column line, a second controlled node, and a gate coupled to the write row line. The read transistor has a first controlled node coupled to the read column line, a second controlled node coupled to the read row line, and a gate coupled to the second controlled node to define a charge storage node.

6 Claims, 3 Drawing Sheets

TWO TRANSISTOR DRAM CELL

This is a continuation of co-pending application Ser. No. 07/615,706 filed on Nov. 21, 1990 now abandoned.

BACKGROUND OF THE INVENTION

The present invention relates to a semiconductor memory cell using metal-oxide-silicon ("MOS") transistors, and more particularly to a structure of a dynamic random access memory ("DRAM") cell that is suitable for large scale integration and has a nondestructive read mode.

Two general types of DRAM cells include a three transistor cell shown in FIG. 1 and a one transistor cell shown in FIG. 2.

The three transistor cell 10 includes a write select line 12 (also referred to as a write row line), a read select line 14 (also referred to as a read row line), a write digit line 16 (also referred to as a write column line), a ground line 18, and a read digit line 20 (also referred to as a read column line). A write transistor 22 has a gate coupled to the write select line 12 and a controlled node coupled to write digit line 16. (The drain and source of MOS transistors are referred to as "controlled nodes" since MOS transistors are symmetrical. The drain and source have no independent significance and are determined solely by the applied voltages.) An amplifying transistor 24 has a gate coupled to the other controlled node of the write transistor 22 to define a charge storage node 28. The parasitic capacitance of node 28 is used to store the charge. Additional capacitance can be used if desired, but this increases cell size. One controlled node of amplifying transistor 24 is coupled to ground line 18. A read transistor 26 has a controlled node coupled to the other controlled node of amplifying transistor 24, a gate coupled to the read select line 14, and another controlled node coupled to the read digit line 20.

The characteristic feature of the three transistor cell 10 is that data stored on the charge storage node 28 is nondestructively read out to the read digit line 20. Note that there is no resistive path from charge storage node 28 to the read digit line 20. However, the nondestructive readout and the benefit of the amplifying transistor 24 are at the price of memory cell size. Note that three transistors and five lines are required for each memory cell 10. Therefore, the three transistor memory cell has limited applications in large scale integration.

In place of the three transistor memory cell 10 described above, a one transistor, one capacitor memory cell 30 is shown in FIG. 2. A single transistor 38 has combined read and write functions. The gate of transistor 38 is coupled to a select line 32 (also referred to as a row line) and one controlled node of transistor 38 is coupled to a digit line 34 (also referred to as a column line). The other controlled node of transistor 38 is coupled to one plate of an integrated capacitor 40. The other plate of the capacitor is coupled to VDD, typically five volts, or some other reference voltage between five volts and ground. The data that is written into and read out of memory cell 30 is stored on integrated capacitor 40. Note that capacitor 40 is not the parasitic capacitance of transistor 38, but a separate circuit element.

Thus, memory cell 30 includes three lines, one transistor and one capacitor. The size of the one transistor memory cell 30 is highly desirable for large scale integration. However, data stored on capacitor 40 is destructively read out of memory cell 30 since there is a resistive path through transistor 38 from the capacitor 40 to the digit line 34.

What is desired is a memory cell having a nondestructive readout feature, yet having a minimum cell area suitable for large scale integration on an integrated memory array.

SUMMARY OF THE INVENTION

It is therefore an object of the present invention to provide a semiconductor memory cell have a nondestructive readout feature.

Another object of the invention is to provide a semiconductor memory cell having a minimum cell area suitable for large scale integration on an integrated memory array.

Other objects, features, and advantages of the present invention are obvious to those skilled in the art upon a reading of the following specification and claims in light of the accompanying drawing figures.

According to the present invention, a semiconductor memory cell includes a write row line, a read row line, a write column line, a read column line, a single MOS write transistor, and a single MOS read transistor. The write transistor has a first controlled node coupled to the write column line, a second controlled node, and a gate coupled to the write row line. The read transistor has a first controlled node coupled to the read column line, a second controlled node coupled to the read row line, and a gate coupled to the second controlled node to define a charge storage node. In operation, the read column line is voltage limited to prevent read transistors in adjacent rows from turning on. In addition, the memory cell is periodically refreshed to maintain the charge on the charge storage node.

DETAILED DESCRIPTION OF THE PREFERRED EMBODIMENT

Figure 1:
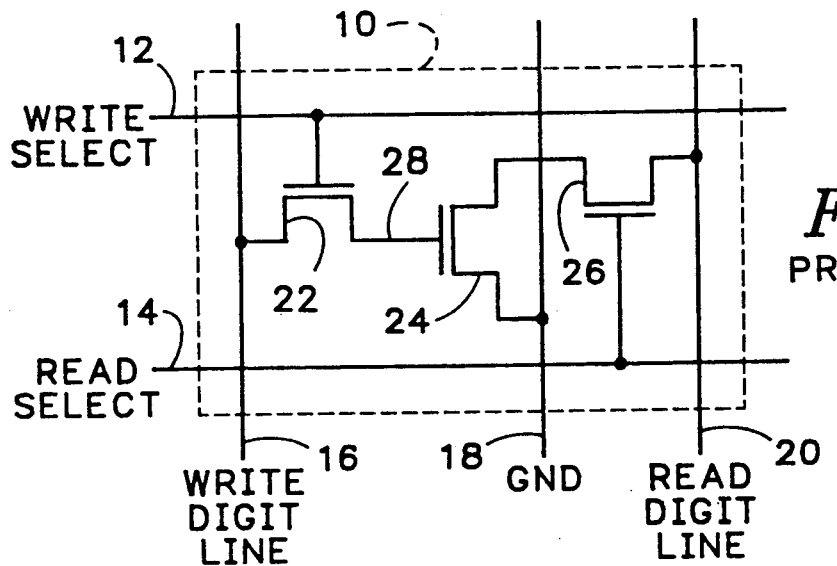
FIG. 1 is a schematic diagram of a prior art three transistor DRAM cell.
Figure 2:
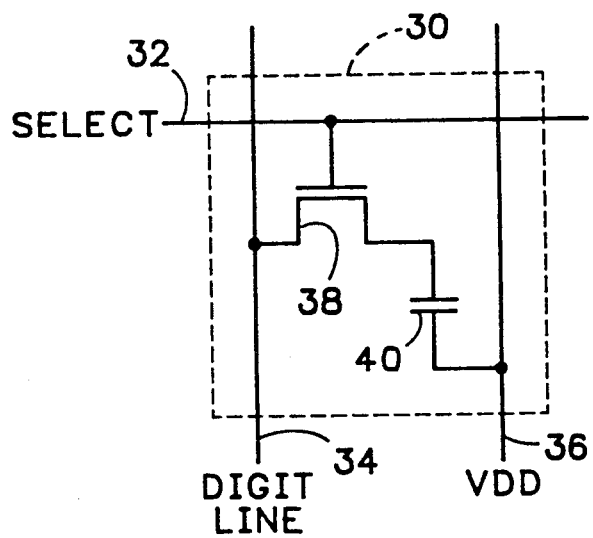
FIG. 2 is a schematic diagram of a prior art one transistor DRAM cell.
Figure 3:
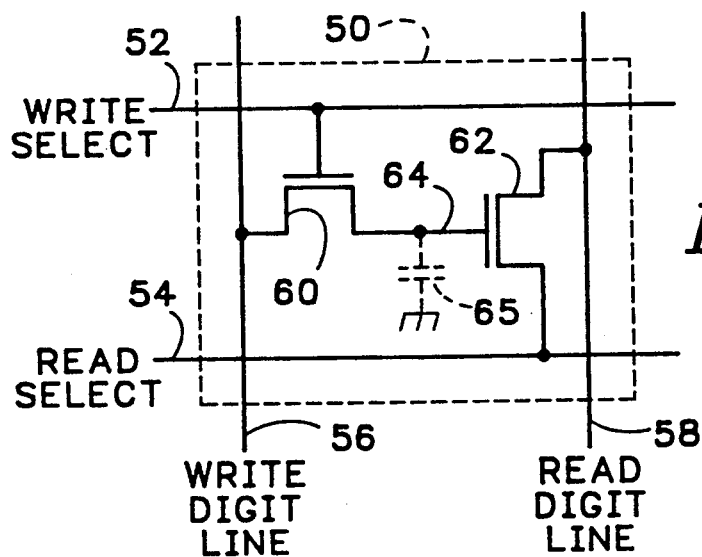
FIG. 3 is a schematic diagram of a two transistor DRAM cell according to the present invention.

A semiconductor DRAM cell 50 is shown in FIG. 3 including a write select or write row line 52, a read select or read row line 54, a write digit or write column line 56, a read digit or read column line, a single n-channel MOS write transistor 60, and a single n-channel MOS read transistor 62. The write transistor 60 has a first controlled node coupled to the write column line 56, a second controlled node, and a gate coupled to the write row line 52. A read transistor 62 has a first controlled node coupled to the read column line 58, a second controlled node coupled to the read row line 54, and a gate coupled to the second controlled node of the read transistor 60 to define a charge storage node 64. The charge storage node 64 has a capacitance 65 equal to the sum of a parasitic capacitance of the second controlled node of the write transistor 60 and a parasitic capacitance of the gate of the read transistor 62.

To write data input the DRAM cell 50, data (a logic one or a logic zero, typically five volts and ground, respectively) is coupled to the write column line 56. A logic one is coupled to the write row line 52 to turn on write transistor 60. Thus, the data at the write column line 56 is transferred through write transistor 60 to charge storage node 64 and stored on parasitic capacitor 65. For a logic zero, the voltage on charge storage node 64 is also zero. For a logic one, the voltage on charge storage node 64 is approximately equal to five volts minus one n-channel threshold voltage. After the data has been written into the DRAM cell 50, the write row line is coupled to a logic zero to turn off write transistor 60 to prevent further data from being written into DRAM cell 50. The read row line 54 is typically coupled to a logic one during the write operation.

To read data out of DRAM cell 50, a logic zero is coupled to the write row line 52 to turn off write transistor 60, to protect the integrity of the data stored at the charge storage node 64. A logic zero is coupled to the read row line 54 and the charge is sensed on the read column line 58 to determine whether a logic one or a logic zero is present on charge storage node 64. If a logic zero is present on charge storage node 64, read transistor 62 is off. If a logic one is present on charge storage node 64, read transistor 62 is on. Thus, read column line 58 can be charge, voltage, or current sensed to determine whether read transistor 62 is off or on and, correspondingly, whether a logic zero or logic one is stored on charge storage node 64.

In reading data out of DRAM cell 50, it is important to voltage limit the read column line 58 such that the voltage on the read column line is not less than a predetermined value, typically five volts minus two n-channel threshold voltages. Voltage limiting is necessary to prevent read transistor 62 in adjacent rows from turning on. For example, if an adjacent DRAM cell 50 contained a logic one, the read transistor 62 turns on when the voltage on read column line 58 is less than five volts minus two n-channel threshold voltages. (Recall that the voltage for a logic one on charge storage node 64 is equal to five volts minus one n-channel threshold voltage.) Voltage limiting can be easily achieved by the correct sizing of read transistor 62 and a pull-up transistor (such as p-channel transistor 74 in FIG. 4) used in the sensing circuitry. The size of the transistors are sized linearly to achieve the desired voltage on read column line 58. The exact size of the two transistors is dependent upon the semiconductor process used, which will determine the value of the n-channel and p-channel threshold voltages as well as other factors.

Figure 4:
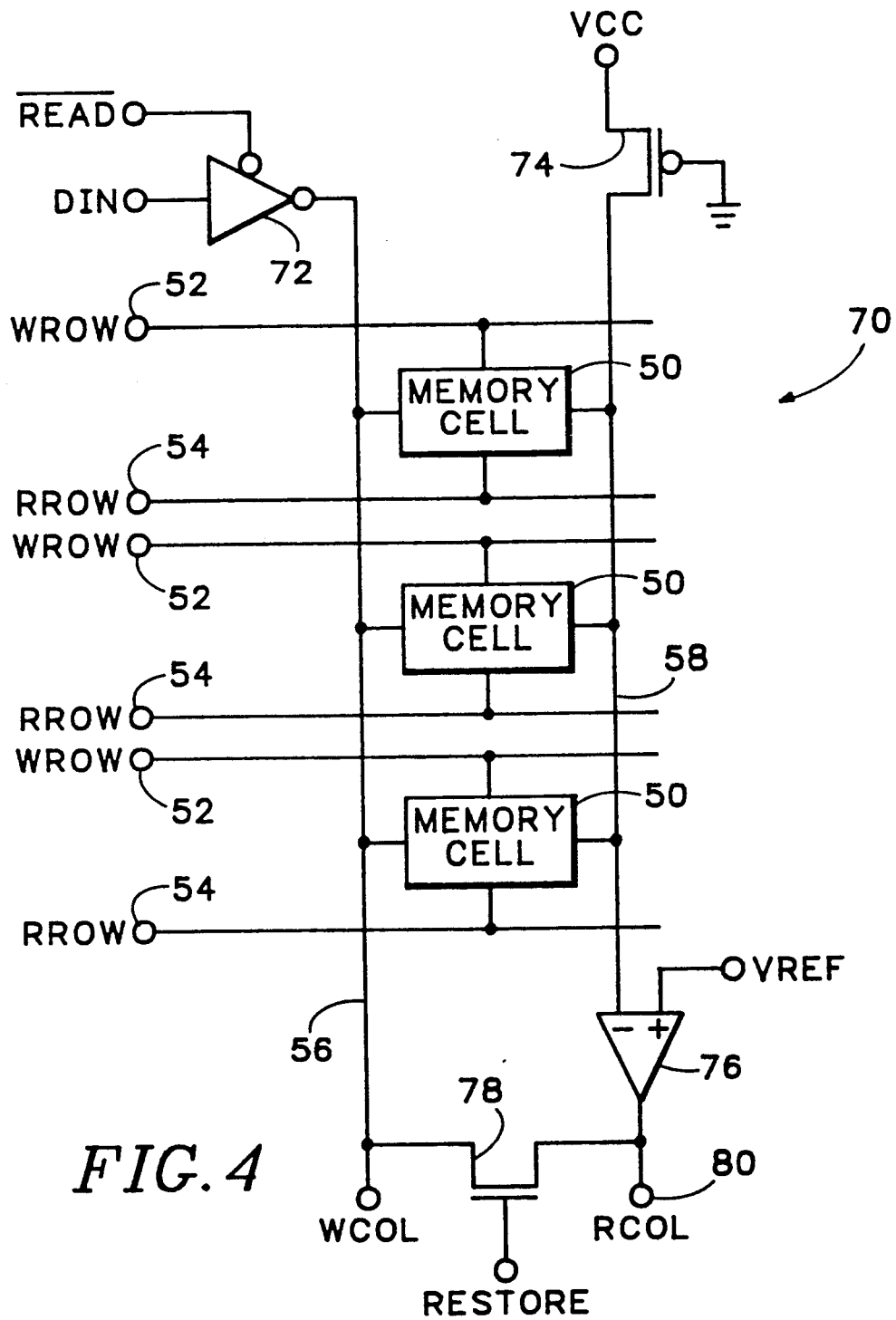
FIG. 4 is a schematic diagram of a portion of a memory array including sensing and refresh circuits suitable for use with the two transistor DRAM cell of the present invention.

Since charge will eventually leak off of charge storage node 64, it is desirable that the voltage on this node be periodically refreshed. One circuit design for sensing the logic state of the DRAM cell 50 and simultaneously refreshing the voltage on the charge storage node 64 is shown in FIG. 4. One column 70, which is only a portion of a larger memory array, includes three DRAM cells 50. In a full array, the DRAM cells are arranged into M rows and N columns, wherein M and N are greater than one and can typically be 1000, for a 1 Megabit DRAM array. The column 70 includes a selectable buffer amplifier 72 for coupling data to the write column line 56. A pull-up p-channel transistor 74 is coupled between the power supply VCC, typically five volts, and the read column line 58. An amplifier or comparator 76 has a positive input coupled to a reference voltage, VREF, typically equal to five volts minus one half of an n-channel threshold voltage. A negative input is coupled to the read column line 58 to sense the voltage on the read column line and provide an indication thereof at the output 80. An n-channel refresh transistor 78 is coupled between the output of amplifier 76 and the write column line to rewrite data into the selected DRAM cell 50 and maintain the integrity of the voltage on charge storage node 64.

The write operation proceeds as described above, with the exception that the inverted READ input of the selectable buffer amplifier 72 is coupled to a logic low to allow the data on the DIN input to be coupled to the write column line 56. In addition, the RESTORE input to the gate of transistor 78 is coupled to a logic zero to ensure that the write operation is not corrupted.

The read operation proceeds as described above, although the output on the read column line 58 is fed back to the write column line 56 through transistor 78 to refresh the voltage on charge storage node 64. Transistor 78 is turned on to provide the feedback path by coupling the RESTORE input to a logic one. Thus, for a logic zero on charge storage node 64, the read transistor 62 is off, and the read column line 58 is a logic high (no current is available to pull this line down). Therefore, the output 80 of amplifier 76 is a logic low. (Note the polarity of the inputs to amplifier 76.) After the data has been read out, the write row line 52 is subsequently coupled to a logic one, allowing the refresh logic low data to be read into charge storage node 64 through write transistor 60. Similarly, for a logic one on charge storage node 64, the read transistor 62 is on, and the read column line 58 is a logic zero (the exact voltage value is dependent upon the relative sizes of read transistor 62 and pull-up transistor 74). Therefore, the output 80 of amplifier 76 is a logic high. After the data has been read out, the write row line 52 is subsequently coupled to a logic one, allowing the refresh logic high data to be read into charge storage node 64 through write transistor 60.

Figure 5:
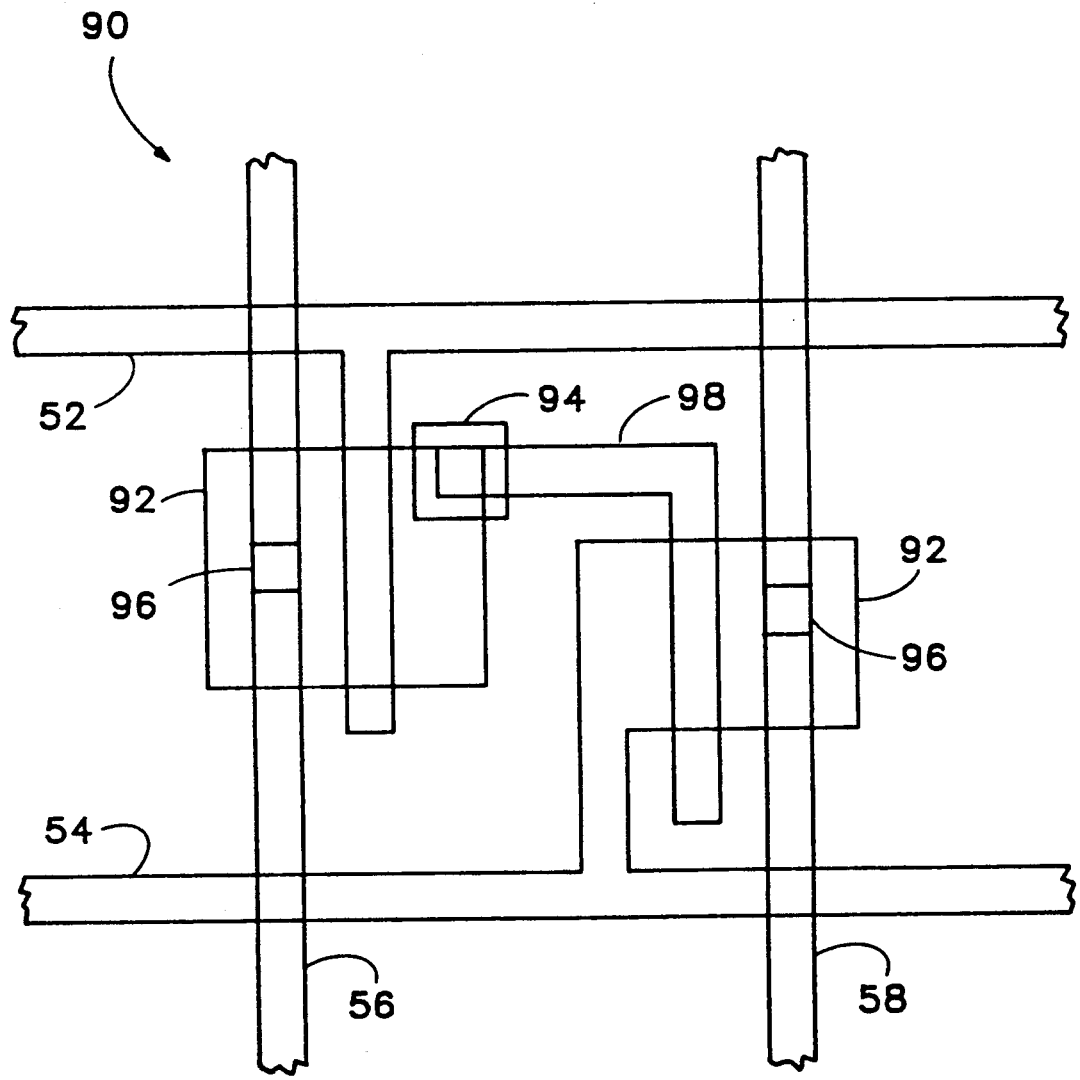
FIG. 5 is a plan view of a layout of the two transistor DRAM cell of the present invention.

A plan view of one layout of the memory cell 50 is shown in FIG. 5. The write row line 52 can be polysilicon. The read row line 54 can be an active area diffusion or implant such as n or p+type silicon. The write column line 56 and the read column line 58 can be metal such as aluminum. The write transistor 60 and the read transistor 62 are defined by active area diffusions or implants 92. A buried contact 94 provides a contact to one of the controlled nodes of write transistor 60. Thus, write transistor 60 and read transistor 62 are coupled together by a run 98, which can be polysilicon. Transistors 60 and 62 contact metal lines 56 and 58 through contact windows 96.

While the invention has been described in a preferred embodiment, it is apparent to those skilled in the art that the disclosed invention can be modified in numerous ways and assume other embodiments than that specifically set forth above. For example, the sensing and refresh circuitry shown in FIG. 4, and the layout of the memory cell 50 shown in FIG. 5 can be changed in many different ways. Accordingly, it is intended that all modifications of the invention that fall within the true spirit and scope of the present invention are covered by the appended claims.

I claim:

1. A semiconductor memory array comprising:
a plurality of write row lines;

a plurality of read row lines;
a plurality of write column lines;
a plurality of read column lines;
a plurality of two-transistor memory cells, each memory cell including a write transistor having a first controlled node coupled to the respective write column line, a second controlled node, and a gate coupled to the respective write row line; and a read transistor having a first controlled node coupled to the respective read column line, a second controlled node coupled to the respective read row line, and a gate coupled to the second controlled node of the write transistor to define a charge storage node;
a plurality of loads, each load being coupled between a source of power supply voltage and the respective read column line; and
means for preventing the read transistor from turning on in non-selected rows during a read operation including means for voltage limiting the read column line during the read operation such that the voltage on the read column line is not less than the power supply voltage minus two transistor threshold voltages.

2. A semiconductor memory array as in claim 1 in which the charge storage node has a capacitance equal to the sum of a parasitic capacitance of the second controlled node of the write transistor and a parasitic capacitance of the gate of the read transistor.

3. A semiconductor memory array as in claim 1 in which each load comprises a pull-up transistor, wherein the pull-up transistor and the read transistor are linearly sized to limit the voltage on the read column line.

4. A semiconductor memory array as in claim 3 in which the pull-up transistor comprises a P-channel transistor and the read transistor comprises an N-channel transistor.

5. A method for reading data out of a selected memory cell in an array of memory cells; each cell having a single write transistor and a single read transistor; the write transistor having a first controlled node coupled to a write column line, a second controlled node, and a gate coupled to a write row line; and the read transistor having a first controlled node coupled to a read column line, a second controlled node coupled to a read row line, and a gate coupled to the second controlled node to define a charge storage node, the method comprising the steps of:
providing a plurality of loads coupled between a source of power supply voltage and the respective read column line;
coupling a logic zero to the write row line of the selected cell;
coupling a logic zero to the read row line of the selected cell;
sensing charge on the read column line of the selected cell; and
sizing the load in relationship to the read transistor of the selected cell to voltage limit the read column line such that the voltage on the read column line cannot be less than the power supply voltage minus two transistor threshold voltages and read transistors in non-selected rows are prevented from turning on.

6. The method of claim 5 in which the step of sizing the load comprises linearly sizing a P-channel pull-up transistor load in relationship to an N-channel read transistor.

* * * * *